(12) United States Patent
Scharf et al.

(10) Patent No.: US 12,249,561 B2
(45) Date of Patent: Mar. 11, 2025

(54) SEMICONDUCTOR DEVICE ARRANGEMENT WITH COMPRESSIBLE ADHESIVE

(71) Applicant: Infineon Technologies AG, Neubiberg (DE)

(72) Inventors: Thorsten Scharf, Lappersdorf (DE); Frank Singer, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 315 days.

(21) Appl. No.: 17/743,601

(22) Filed: May 13, 2022

(65) Prior Publication Data

US 2023/0369181 A1 Nov. 16, 2023

(51) Int. Cl.
*H01L 23/495* (2006.01)
*H01L 23/00* (2006.01)
(Continued)

(52) U.S. Cl.
CPC .... *H01L 23/49534* (2013.01); *H01L 23/3142* (2013.01); *H01L 23/4924* (2013.01); *H01L 23/49503* (2013.01); *H01L 23/49822* (2013.01); *H01L 24/29* (2013.01); *H01L 24/30* (2013.01); *H01L 24/32* (2013.01); *H01L 24/33* (2013.01); *H01L 24/83* (2013.01); *H01L 25/0652* (2013.01); *H01L 25/0657* (2013.01); H01L 2224/13191 (2013.01); H01L 2224/13491 (2013.01); H01L 2224/2919 (2013.01); H01L 2224/29291 (2013.01); H01L 2224/32245 (2013.01)

(58) Field of Classification Search
CPC . H01L 2224/13191; H01L 2224/13491; H01L 23/49534; H01L 23/3142; H01L 23/49503; H01L 24/32; H01L 24/33; H01L 24/29; H01L 24/30; H01L 2224/29291; H01L 2224/2919; H01L 23/49822; H01L 23/4924; H01L 24/83; H01L 24/31; H01L 29/30; H01L 25/0657; H01L 25/0652; H01L 2224/32245
See application file for complete search history.

(56) References Cited

U.S. PATENT DOCUMENTS 5,001,542 A * 3/1991 Tsukagoshi ............. H01L 24/05
257/E21.511
6,258,626 B1 * 7/2001 Wang .................. H01L 25/0657
257/E21.705
(Continued)

*Primary Examiner* — Alonzo Chambliss
(74) *Attorney, Agent, or Firm* — Murphy, Bilak & Homiller, PLLC

(57) ABSTRACT

A method of forming a semiconductor package includes providing a first metal substrate; and mounting a stacked arrangement on the first metal substrate, the stacked arrangement comprising a semiconductor die, wherein mounting the stacked arrangement includes: providing a first layer of attachment material between the first metal substrate and the stacked arrangement; and providing a second layer of attachment material within the stacked arrangement at an interface with the semiconductor die, wherein at least one of the first and second layers of attachment material is a compressible layer that includes one or more elastomeric elements embedded within a matrix of solder material.

20 Claims, 6 Drawing Sheets

(51) Int. Cl.
*H01L 23/31* (2006.01)
*H01L 23/492* (2006.01)
*H01L 23/498* (2006.01)
*H01L 25/065* (2023.01)

(56) References Cited

U.S. PATENT DOCUMENTS

| | | | |
|---|---|---|---|
| 6,486,003 B1* | 11/2002 | Fjelstad | H01L 24/83 |
| | | | 438/117 |
| 2012/0089180 A1* | 4/2012 | Fathi | B32B 7/14 |
| | | | 257/E23.116 |
| 2021/0327842 A1 | 10/2021 | Kim et al. | |

* cited by examiner

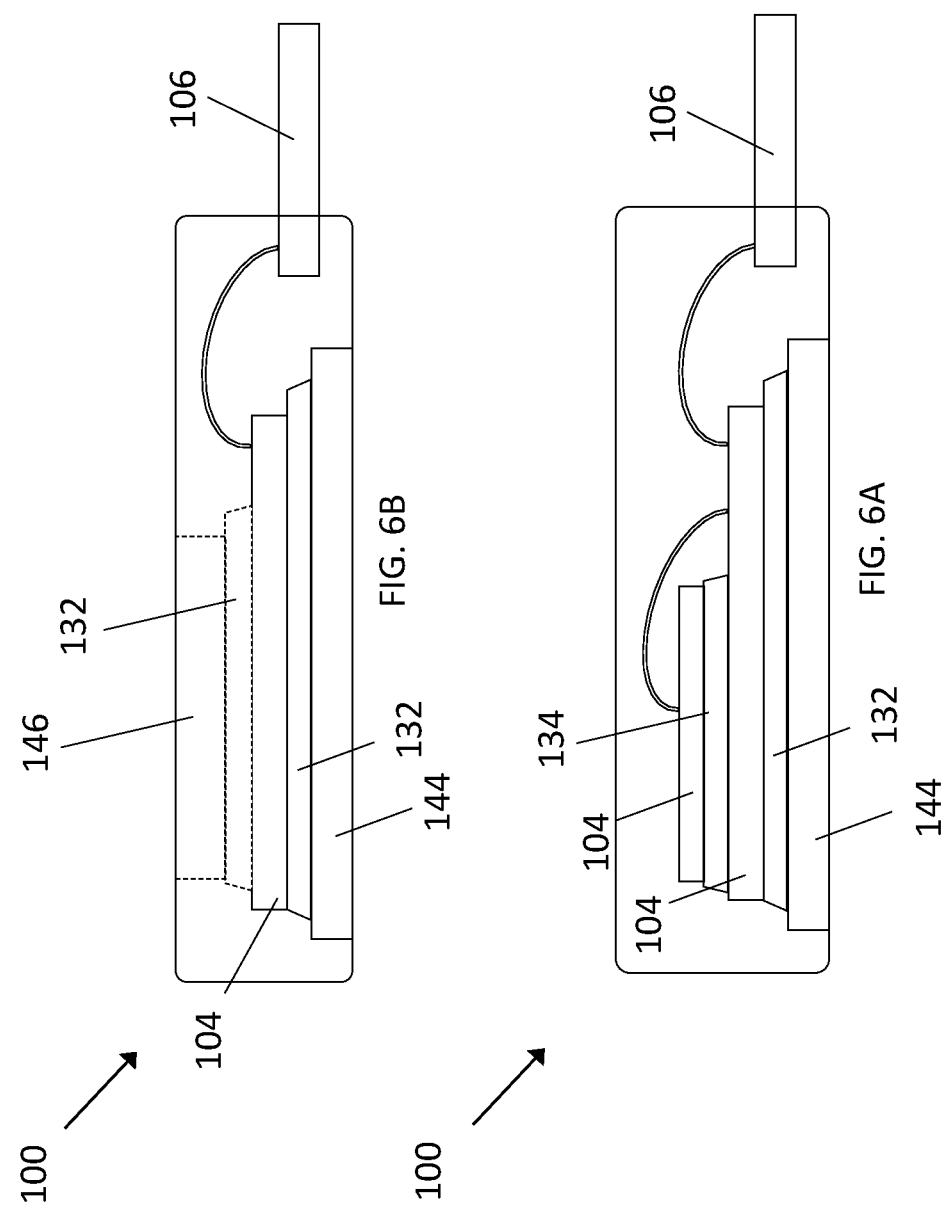

SEMICONDUCTOR DEVICE ARRANGEMENT WITH COMPRESSIBLE ADHESIVE

BACKGROUND

Many different applications such as automotive and industrial applications utilize power device packages to perform power conversion, e.g., AC to DC, DC to DC, etc. Power device packages may comprise multiple semiconductor dies in a single package or housing, and may include power conversion circuits such as single and multi-phase half-wave rectifiers, single and multi-phase full-wave rectifiers, voltage regulators, inverters, etc. Modern power device packages are designed for minimal power losses and can improve the energy efficiency of a power system. Power device packages can form parts of power efficient solutions to reduce or prevent anthropogenic emissions of greenhouse gases. For instance, hybrid electric vehicles (HEVs) or electric vehicles (EVs) utilize power device packages to perform power conversion, inversion, switching, etc., in a power efficient manner.

One challenge associated with constructing power device packages pertains to geometric variation in the elements that form the assembly. For example, the dimensions of components, such as height, width, thickness, etc., may vary slightly as between multiple parts that are nominally identical to one another. These minor variations make it more challenging to produce the device package to conform to specifications.

SUMMARY

A method of forming a semiconductor package is disclosed. According to an embodiment, the method comprises providing a first metal substrate; and mounting a stacked arrangement on the first metal substrate, the stacked arrangement comprising a semiconductor die, wherein mounting the stacked arrangement comprises: providing a first layer of attachment material between the first metal substrate and the stacked arrangement; and providing a second layer of attachment material within the stacked arrangement at an interface with the semiconductor die, wherein at least one of the first and second layers of attachment material is a compressible layer that comprises one or more elastomeric elements embedded within a matrix of solder material.

According to another embodiment, the method comprises providing a first metal substrate, and mounting a semiconductor die on the first metal substrate, wherein mounting the semiconductor die comprises providing a first layer of attachment material between the semiconductor die and the first metal substrate, and wherein the first layer of attachment material is a compressible layer that comprises one or more elastomeric elements embedded within a matrix of solder material.

A semiconductor device is disclosed. According to an embodiment, the semiconductor device comprises a first metal substrate; a semiconductor die mounted on the first metal substrate; and a layer of attachment material mechanically coupled to the semiconductor die, wherein the layer of attachment material is a compressible layer that comprises one or more elastomeric elements embedded within a matrix of solder material.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates an interior view of a semiconductor package, according to embodiments. FIG. 2A illustrates the semiconductor package with a stacked arrangement comprising a spacer above a semiconductor die; and FIG. 2B illustrates the semiconductor package with a stacked arrangement comprising a spacer below a semiconductor die.

FIGS. 3A, 3B, and 3C, illustrates an attachment interface of a semiconductor package. FIG. 3A illustrates an attachment interface with a compressible attachment layer comprising a plurality of elastomeric elements embedded within a matrix of solder material; and FIGS. 3B and 3C illustrate elastomeric elements, according to embodiments.

FIGS. 4A and 4B, illustrates steps for soldering an assembly comprising a compressible attachment layer. FIG. 4A illustrates the assembly arranged in a soldering jig before an upper plate is pressed against the assembly; and FIG. 4B illustrates the assembly arranged in a soldering jig after an upper plate is pressed against the assembly.

FIG. 6, which includes FIGS. 6A and 6B, illustrates a semiconductor package, according to embodiments. FIG. 6A illustrates a semiconductor package with a stacked arrangement of two semiconductor dies mounted on a die pad; and FIG. 6A illustrates a semiconductor package with one semiconductor die mounted on a die pad.

DETAILED DESCRIPTION

A method of forming a semiconductor package with an advantageous soldering technique and corresponding semiconductor package with advantageous soldered joints are described herein. The semiconductor package comprises a semiconductor die mounted on a metal substrate with an attachment layer disposed at an interface with the semiconductor die and/or metal substrate. The attachment layer is a compressible layer that comprises one or more elastomeric elements embedded within a matrix of solder material. The elastomeric elements allow the attachment layer to elastically compress without causing damage to the components of the assembly and/or without causing unwanted bleed out of the solder material. The assembly comprising the semiconductor die can be soldered by placing the assembly within a soldering jig that presses against an upper side of the semiconductor die or an element that is disposed on top of the semiconductor die. The compressibility of the solder material allows the assembly to be formed to a prespecified height despite small variation in the thickness of the components used to form the assembly while simplifying the design of the soldering jig and minimizing its maintenance costs.

Figure 1:
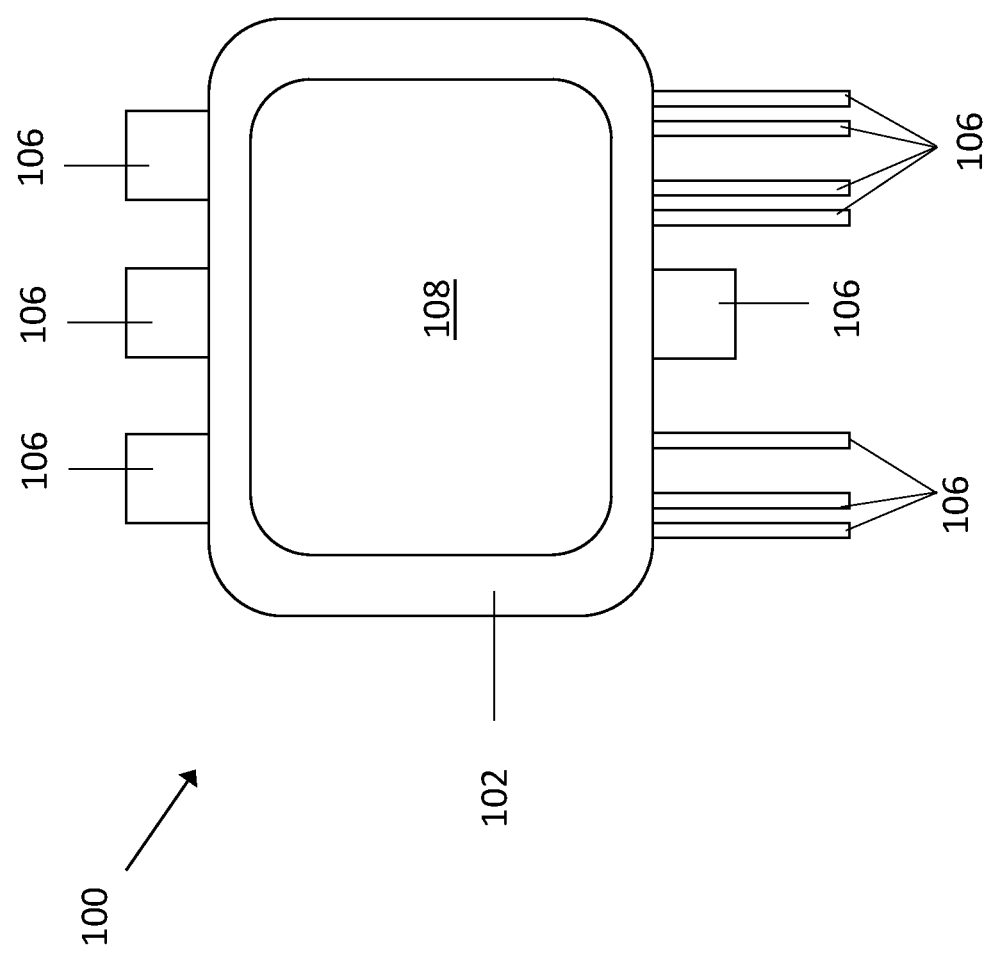
FIG. 1 illustrates an exterior view of a semiconductor package, according to an embodiment.

Referring to FIG. 1, a semiconductor package 100 is depicted, according to an embodiment. The semiconductor package 100 comprises an encapsulant body 102 104 that protects one or more semiconductor dies 104 (shown in FIG. 2) within the encapsulant body 102 and electrically isolates the semiconductor dies 104 and associated electrical connections. The encapsulant body 102 can be formed by a molding process such as injection molding, transfer molding, compression molding, etc. According to these techniques, an assembly comprising a circuit carrier or lead frame and one or more semiconductor dies 104 mounted thereon is arranged into a molding tool, and a mold compound is injected into the molding tool and subsequently cured to form the encapsulant body 102. The mold compound which forms the encapsulant body 102 can comprise dielectric materials such as epoxy, thermosetting plastic, polymer, resin, etc. Other techniques can be used to form the encapsulant body 102 as well. Other types of encapsulation techniques, such as lamination techniques may be possible as well to form the encapsulant body 102.

The semiconductor package 100 comprises a plurality of electrically conductive leads 106 that protrude out from the encapsulant body 102. The electrically conductive leads 106 form terminal connections to the devices encapsulated within the encapsulant body 102. The electrically conductive leads 106 may comprise power leads 106 that form power connections to the semiconductor dies 104. These power leads 106 accommodate the rated blocking voltage and switching current of the semiconductor dies 104, e.g., the source and drain terminals in the case of a MOSFET, emitter and collector terminals in the case of an IGBT, and so forth. The electrically conductive leads 106 may comprise signal leads 106 that form control terminals and/or sensing terminals of the semiconductor package 100. In the depicted embodiment, the power leads 106 may correspond to the wider leads 106 and the signal leads 106 may correspond to the narrower leads 106.

According to an embodiment, the semiconductor package 100 is configured as a power module. A power module refers to a type of semiconductor device that comprises multiple power devices incorporated therein and has the necessary electrical interconnect and cooling capacity to accommodate the high-power operation of these devices. A power module may comprise multiple semiconductor dies 104 arranged as a power conversion circuit, such as a such as a DC to DC converter, DC to AC converter, etc. These power conversion circuits may comprise a half-bridge circuit which comprises a high-side switch connected in series with a low-side switch. The high-side and low-side switch may be provided by one or a group of discrete power transistor dies, MOSFETs, IGBTs, IGBTs and diodes, etc.

As shown in FIG. 1, the semiconductor package 100 comprises an exposed substrate 108 at one side of the encapsulant body 102. This exposed substrate 108 can correspond to the rear side of a metal die pad or a power electronics substrate that is thermally coupled to the semiconductor dies 104 contained within the encapsulant body 102. According to an embodiment, the semiconductor package 100 is configured as a double-sided cooling power module. In that case, the semiconductor package 100 comprises two substrates 108 that are thermally coupled to the semiconductor dies 104 at opposite sides. The rear surface of each substrate 108 is exposed at opposite facing sides of the encapsulant body 102 such that the view shown in FIG. 1 can correspond to either side of the semiconductor package 100. An example of a double-sided cooling power module having these features is disclosed in U.S. Pat. No. 11,004,764 to Hoegerl et al., and U.S. Pat. No. 11,018,072 to Hoegerl et al., the content of each document being incorporated by reference herein in their entirety.

Figure 2:
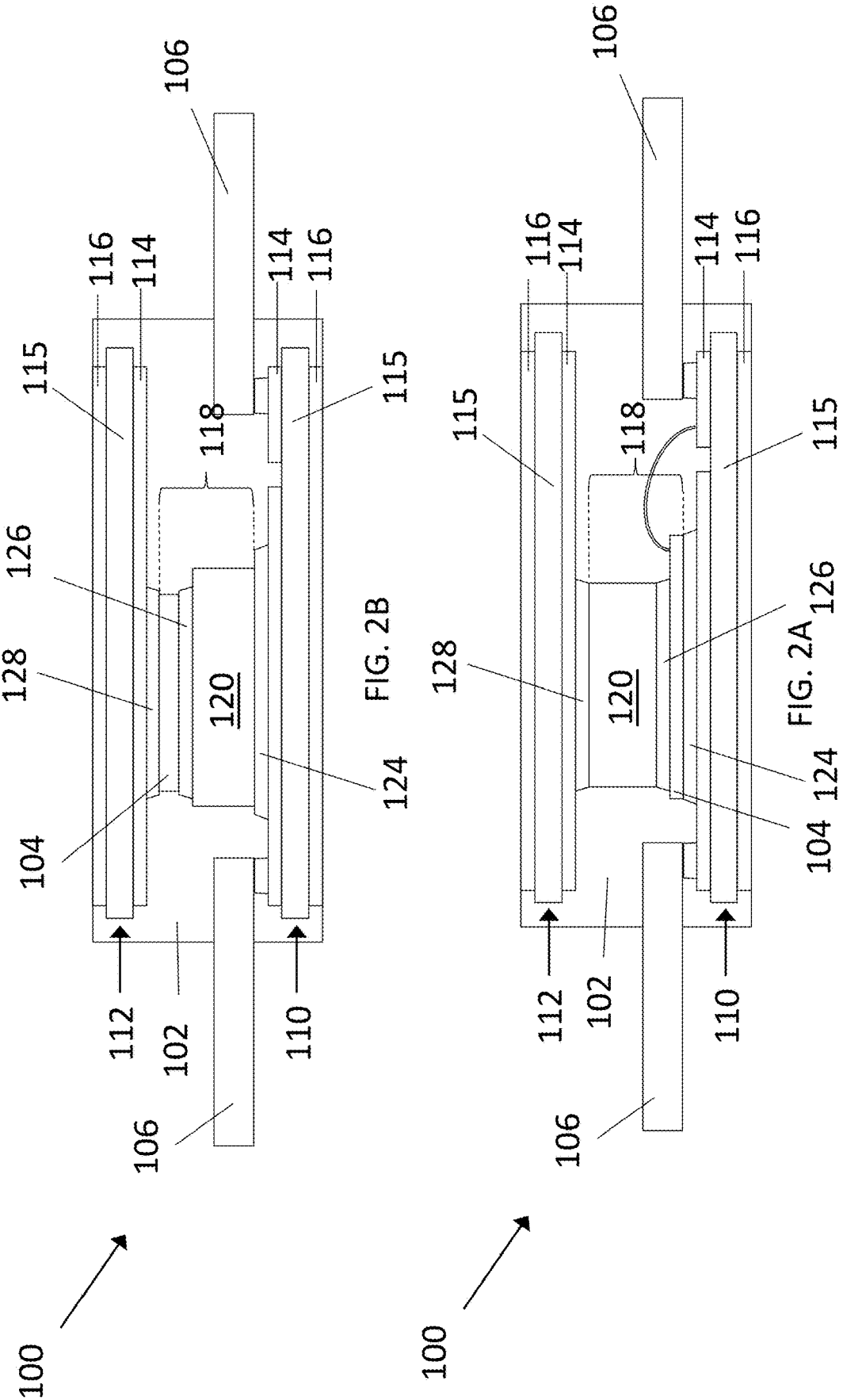
FIG. 2, which includes

Referring to FIG. 2, an internal arrangement of the semiconductor package 100 is shown, according to two different embodiments. In each case, the semiconductor package 100 comprises a first power electronics carrier 110, a second power electronics carrier 112. The first and second power electronics carriers 110, 112 can be any type of power electronics carrier, such as a Direct Copper Bonding (DCB) substrate, a Direct Aluminum Bonding (DAB) substrate, an Active Metal Brazing (AMB) substrate, or an Insulated Metal Substrate (IMS). These power electronics carriers comprise a structured metallization layer 114 disposed on one side of an electrically insulating substrate 115 and a second metallization layer disposed on an opposite facing rear side of the electrically insulating substrate 115. The structured metallization layer 114 and the second metallization layer 116 may comprise or be plated with any or more of Cu, Ni, Ag, Au, Pd, Pt, for example. The electrically insulating substrate 115 of the power electronics carrier may comprise a ceramic material such as $Al_2O_3$(Alumina) AlN (Aluminium Nitride), e.g., in the case of a DCB, DAB or AMB, and may comprise filled materials such as epoxy resin or polyimide, e.g., in the case of an IMS substrate. The encapsulant body 102 is formed such that the second metallization layer 116 from the rear side of the first power electronics carrier 110 is exposed from a first side of the encapsulant body 102, and such that the second metallization layer 116 from the rear side of the second power electronics carrier 112 is exposed from a second side of the encapsulant body 102, thus providing a double-sided cooling arrangement.

The leads 106 of the semiconductor package 100 are attached to the first power electronics carrier 110, e.g., by welding, soldering, etc. The semiconductor package 100 comprises electrical interconnect elements that provide connections between the semiconductor dies 104 and the leads 106. These electrical interconnect elements may comprise any type of interconnect element such as bond wires (as shown) or metal clips, ribbons, etc. The second power electronics carrier 112 may also provide electrical redistribution between the various devices mounted on the first power electronics carrier 110 and/or to the package leads 106. Alternatively, the second power electronics carrier 112 may serve a purely cooling function without conducting any electrical signals.

The semiconductor package 100 comprises a stacked arrangement 118 between the first power electronics carrier 110 and the second power electronics carrier 112. The stacked arrangement 118 comprises one of the semiconductor dies 104 and a spacer 120. The semiconductor die 104 can be a vertical device, such as a vertical IGBT, MOSFET, diode, etc. with load terminals disposed on opposite facing main and rear surfaces of the semiconductor die 104. The spacer 120 can be a passive element formed from an electrically and thermally conductive metal such as copper, aluminum, nickel, molybdenum, aluminum silicon-carbide, aluminum silicon alloy, etc., and alloys or combinations thereof. The spacer 120 can provide an electrical connection between a terminal of the semiconductor die 104 and one of the power electronics carriers 110, 112. Alternatively, the spacer 120 can be used to thermally couple the semiconductor die 104 to one of the power electronics carriers 110, 112 without necessarily conducting an electrical current.

FIGS. 2A and 2B illustrate two potential arrangements for the stacked arrangement 118. In the embodiment of FIG. 2A, the semiconductor die 104 is mounted on the structured metallization layer 114 of the first power electronics carrier 110 and the spacer 120 is mounted between an upper side of the semiconductor die 104 and the second power electronics carrier 112. In the embodiment of FIG. 2B, the spacer 120 is mounted on the structured metallization layer 114 of the first power electronics carrier 110 and the semiconductor die 104 is mounted between the spacer 120 and the second power electronics carrier 112. In either arrangement, the stacked arrangement 118 is mounted by layers of attachment material. In particular, the semiconductor package 100 comprises a first layer 124 of attachment material, a second layer 126 of attachment material, and a third layer 128 of attachment material. The first layer 124 attachment material is provided between the first power electronics carrier 110 and the stacked arrangement 118. The second layer 126 of attachment material is provided within the stacked arrangement 118 at an interface between the semiconductor die 104 and the spacer 120. The third layer 128 of attachment material is provided between the stacked arrangement 118 and the second power electronics carrier 112. The first, second and third layers 124, 126, 128 of attachment material mechanically couple the various elements of the stacked arrangement 118 to one another and mechanically couple the stacked arrangement 118 to the first and second power electronics carriers 110, 112. The first, second and third layers 124, 126, 128 of attachment material may provide electrically and thermally conductive connections between the various elements of the stacked arrangement 118 and the first and second power electronics carriers 110, 112.

Figure 3:
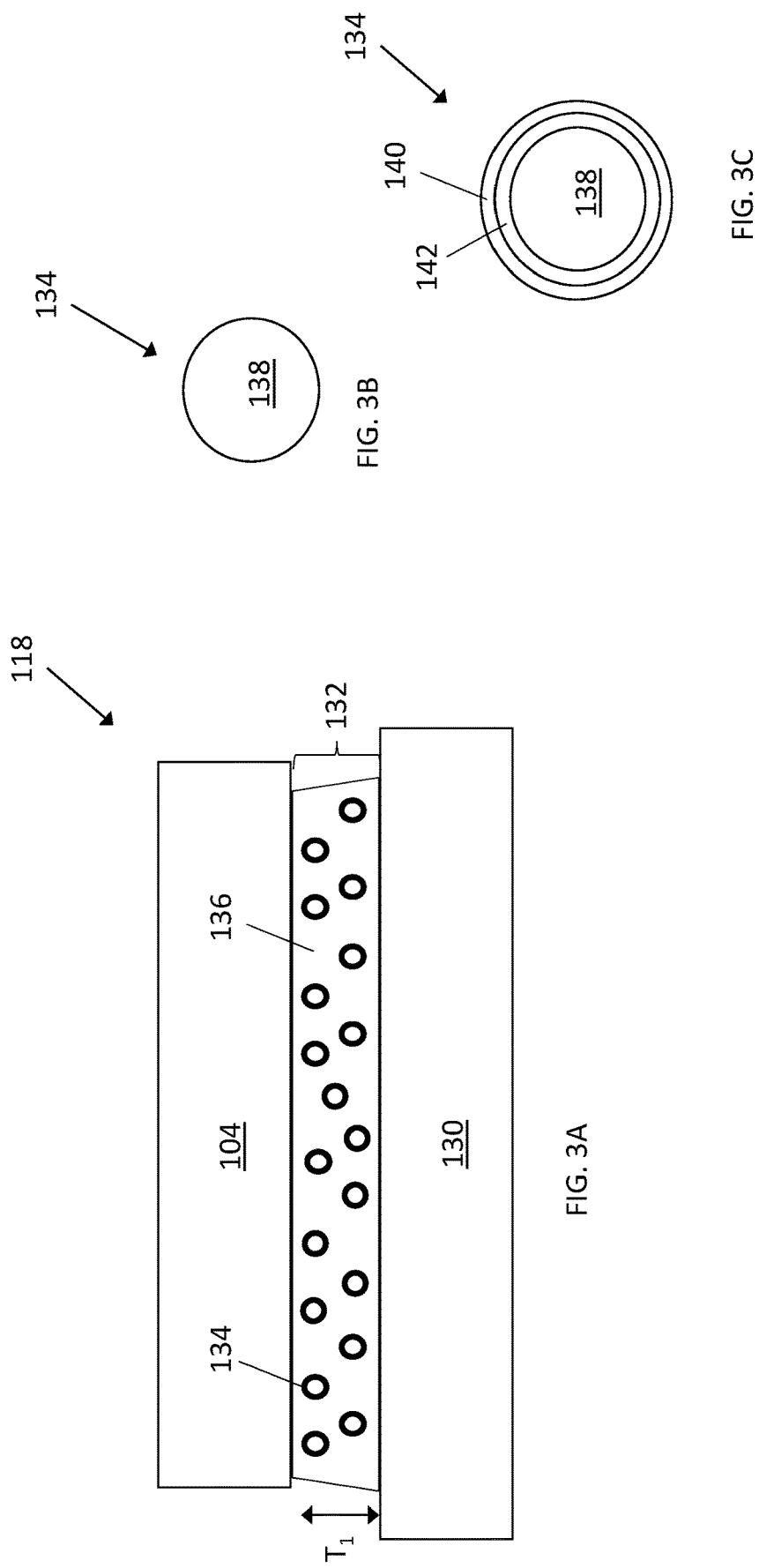
FIG. 3, which includes

Referring to FIG. 3, an attachment interface from the stacked arrangement 118 is shown. The attachment interface comprises a metal substrate 130 and a semiconductor die 104. The semiconductor die 104 is attached to the metal substrate 130 by a layer of attachment material 132. This layer of attachment material 132 can correspond to any one of the first, second and third layers 124, 126, 128 of attachment material from the stacked arrangement 118 of FIG. 2. The metal substrate 130 can correspond to any one of: a pad portion of the structured metallization layer 114 of the first power electronics carrier 110; a pad portion of the structured metallization layer 114 of the second power electronics carrier 112; and the carrier 104, as the case may be.

The layer of attachment material 132 in the stacked arrangement 118 is shown. This type of layer has a thickness $T_1$ that can be modulated through the application of external pressure during the attachment process. That is, compression force can be applied between the metal substrate 130 and the semiconductor die 104 after the semiconductor die 104 is arranged on the layer of attachment material 132, thereby reducing a thickness $T_1$ of the layer of attachment material 132 and thus reducing the distance between the metal substrate 130 and the semiconductor die 104. When the layer of attachment material 132 is compressed, it remains intact and capable of being used as an electrical and mechanical joining material.

The layer of attachment material 132 comprises one or more elastomeric elements 134. An elastomeric element 134 is a feature formed from an elastomer, i.e., a natural or synthetic polymer having elastic properties.

The elastomeric elements 134 are embedded within a matrix of solder material 136. This matrix of solder material 136 can comprise any solder material suitable for joining two metal joining partners together in electronics applications. The matrix of solder material 136 can be melted at a reflow temperature and subsequently cooled, thereby forming a soldered joint between the elements being joined, that mechanically and electrically connects these elements together in a commonly known manner. The compressibility, i.e., thickness $T_1$ modulation, of the layer of attachment material 132 may exist when the matrix of solder material 136 is in a liquid or quasi-liquid state, e.g., before or during reflow. In other words, during reflow when the solder material 136 is liquefied and cannot yield any significant force to keep the distance between the joining partners, the elastomeric elements 134 align in one layer and provide a distance between the joining partners based on the pressure applied. The matrix of solder material 136 can be eutectic non-eutectic solder. The solder material may comprise alloys of Sn, Pb, Zn, In, Ga, Bi, Cd, Ag, Sb, and Cu, for example. According to an embodiment, the matrix of solder material 136 is a lead-free solder comprising a tin-alloy Sn/Ag/Cu, Sn/Ag, Sn/Ag/Sb, Sn/Sb, Sn/Cu, etc.

According to an embodiment, the layer of attachment material 132 comprises a plurality of elastomeric grain elements dispersed throughout a volume of the matrix of solder material 136. The elastomeric grain elements are individual units of elastomeric material. FIGS. 3B and 3C illustrate two different types of elastomeric elements 134 that can be used as the elastomeric grain elements dispersed throughout the volume of the matrix of solder material 136. In the example of FIG. 3B, the elastomeric elements 134 comprise a spherical core 138 of elastomeric polymer. A diameter of the spherical core 138 can be in the range of 50 μm to 200 μm, for example. The spherical core 138 of elastomeric polymer can be introduced directly into the matrix of solder material 136, thereby providing the compressibility of the layer of attachment material 132. In the example of FIG. 3C, the elastomeric elements 134 are configured as elastomeric solder balls that comprise a spherical core 138 of elastomeric polymer and a solderable coating 140 around the spherical core 138. The solderable coating 140 may have similar or identical properties as the matrix of solder material 136 and thus may be reflowed at the same time to form part of the soldered joint. The solderable coating 140 can be a layer solder material, e.g., a tin-alloy of Sn/Ag/Cu, Sn/Ag, Sn/Ag/Sb, Sn/Sb, Sn/Cu, etc. A thickness of the solderable coating 140 can be in the range of 5 μm to 25 μm, for example. The elastomeric solder balls may also comprise intermediate layers 142 provided between the spherical core 138 and the solderable coating 140. These intermediate layers 142 can comprise metals such as Ni, Cu, etc., that are configured as barrier layers to prevent contamination of the solderable layer. A thickness of the intermediate layers 142 can be in the range of 1 μm to 10 μm, for example.

More generally, the elastomeric elements 134 that are configured as the elastomeric grain elements dispersed throughout the volume of the matrix of solder material 136 can have a variety of different shapes, e.g., spherical, cubic, cylindrical, etc. Within the plurality, the elements can have the same shape or different shapes. The elastomeric elements 134 may be coated with other materials, e.g., in a similar manner as the elastomeric solder ball described above. Alternatively, the elastomeric elements 134 that are configured as the elastomeric grain elements can be provided without any external coating and dispersed throughout the matrix of solder material 136. The elastomeric elements 134 that are configured as the elastomeric grain elements dispersed throughout the volume of the matrix of solder material 136 can be substantially the same size of within a range of sizes. For example, a maximum diameter of each of the grain elements may be in the range of 10 µm to 500 µm, in the range of 50 µm to 300 µm, or in the range of 100 µm to 200 µm.

The distribution of the elastomeric grain elements can be selected based on factors such as desired compressibility of the layer of attachment material 132 and the soldering performance, e.g., mechanical strength, conductivity, etc., of the attachment material. The number of elastomeric grain elements can be selected to ensure a substantially uniform distribution of the elastomeric grain elements and/or a distribution that provides relatively uniform compressibility of the layer of attachment material 132. In an example of this concept, for a layer of attachment material 132 with a thickness in the range of 20 µm to 500 µm, and more preferably in the range of 50 µm to 200 µm mm and an areal footprint in the range of 10 mm$^2$-300 mm$^2$, and preferably in the range of 50 mm$^2$-200 mm$^2$, the layer can be provided with at least three elastomeric grain elements, and more preferably at least 10 elastomeric grain elements, each having a diameter in the range of 100 µm to 200 µm. This ensures a substantially uniform distribution of the elastomeric grain elements such that the layer of attachment material 132 is substantially uniformly compressible. Separately or in combination, the size and number of the grain elements can be selected such that the elastomeric grain elements represent between 5% and 70%, and more preferably between 10% and 30% of the overall volume of the layer of attachment material 132, with the remaining volume corresponding to the solder material. Separately or in combination, the size, number, and elastic properties of the grain elements can be selected to physically support the upper components of the semiconductor package 100, e.g., the second power electronics carrier 112, without any significant elastic deformation when no additional weight is placed thereon, and to elastically compress only when additional weight or pressure is applied to the upper side of the semiconductor package 100.

Figure 4:
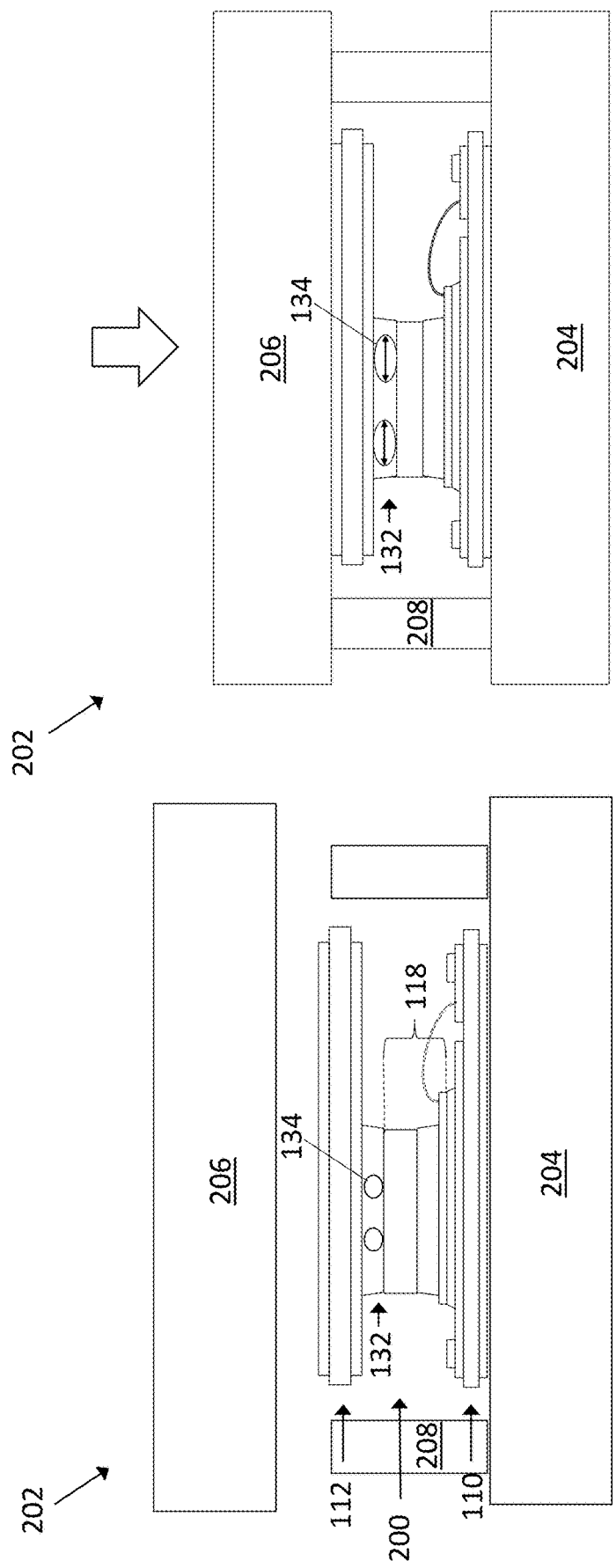
FIG. 4, which includes

Referring to FIG. 4, a soldering process for forming soldered joints from the layers of attachment material in the stacked arrangement 118 between the first power electronics carrier 110 and the second power electronics carrier 112 is shown. According to this process, an assembly 200 comprising the first power electronics carrier 110, the second power electronics carrier 112, and the stacked arrangement 118 is provided within a soldering jig 202. The soldering jig 202 is used to maintain the position of the elements during the soldering process. The soldering jig 202 comprises a baseplate 204, an upper plate 206 and a height limiting stopper 208. The assembly 200 is arranged within a volume of the soldering jig 202 with the first power electronics carrier 110 resting on the baseplate 204. The upper plate 206 of the soldering jig 202 is pressed against the rear side of the second power electronics carrier 112. This pressing force can be applied by an external clamp (not shown). Alternatively, this pressing force can result from the weight of the upper plate 206 or a separate weight applied on the upper plate 206. The height limiting stopper 208 prevents the upper plate 206 from moving any closer to the baseplate 204 and thus defines a desired height of assembly 200 during the soldering. After the pressing, a soldering process is performed whereby the solder material from the assembly 200, e.g., solder from any one or all of the first, second and third layers of attachment material 124, 126, 128 is reflowed, thereby forming soldered joints from this solder material. Other steps including pre-conditioning and decontamination steps may be performed as well.

As shown in FIG. 4A, before the assembly 200 is pressed by the upper plate 206, the assembly 200 arranged within the soldering jig 202 extends past the height limiting stopper 208. That is, the rear surface of the second power electronics carrier 112 is disposed on a plane that is further away from the away from the baseplate 204. At this time, the elastomeric elements 134 from the assembly 200 are in a relaxed or decompressed state. Subsequently, as shown in shown in FIG. 4B, pressing the upper plate 206 of the soldering jig 202 against the height limiting stopper 208 elastically compresses the elastomeric elements 134. That is, the elastomeric elements 134 become elastically deformed, thereby modulating the thickness of the attachment layers comprising the elastomeric elements 134 and permitting the height of the assembly 200 to become level with the height of the height limiting stopper 208. According to an embodiment, the elastomeric elements 134 are arranged such that a center of balance of the assembly 200 is within the compressible region of the assembly, i.e., within the layer of attachment material 132. This center of balance can be created by tailoring the arrangement, number and density of the elastomeric elements 134 within the layer of attachment material 132 in a similar manner as described above. A laterally non-uniform or lopsided distribution of the elastomeric elements 134 may be provided to create the necessary center of balance.

Figure 5:
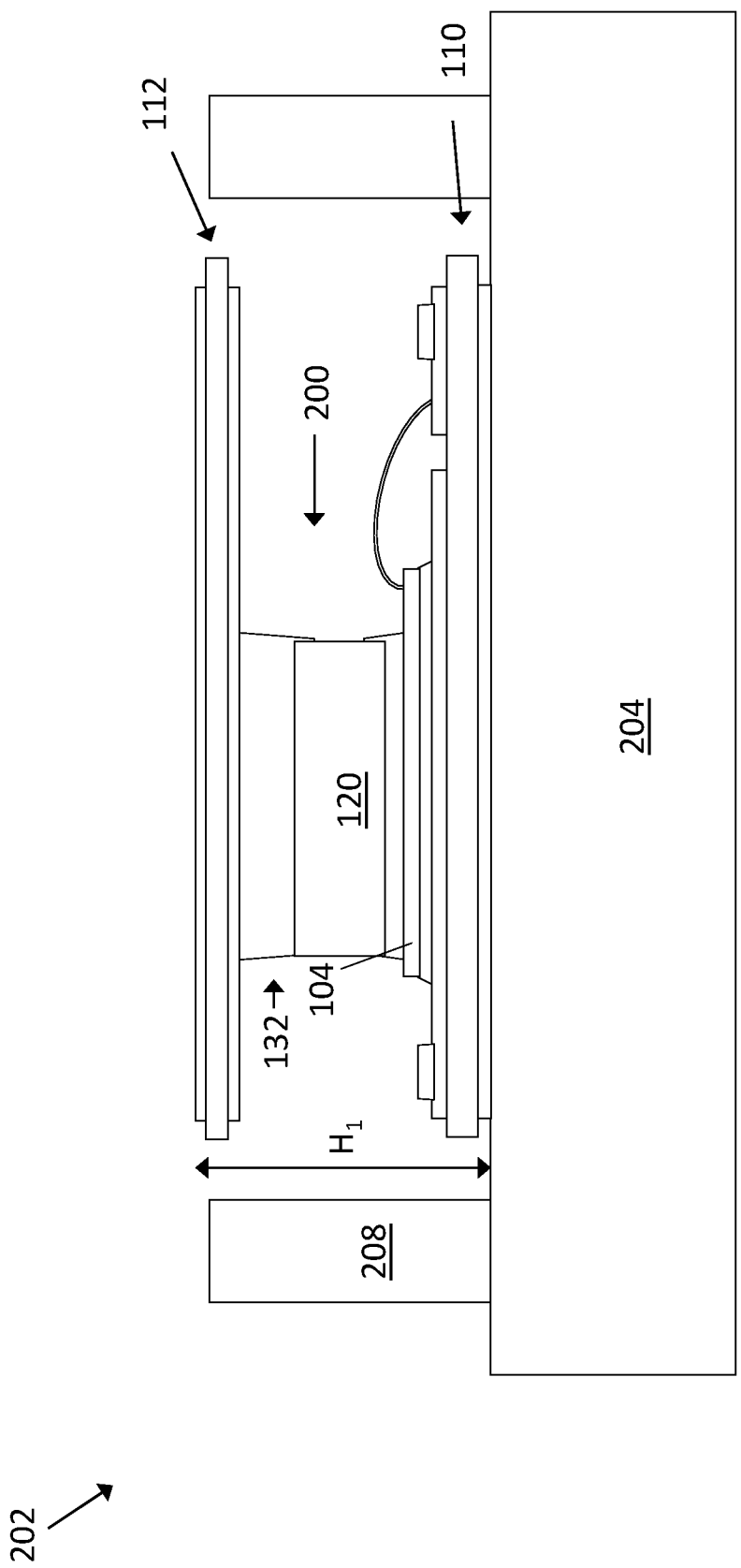
FIG. 5 illustrates an assembly arranged in a soldering jig with the height of the assembly extending past the height limiting stopper, according to an embodiment.

Referring to FIG. 5, an enlarged view of the assembly 200 is shown before pressing the upper plate 206 against the assembly 200. The compressible properties of the attachment layers as described herein allow for an advantageous tailoring of the geometric parameters of the assembly 200 for consistent height and with minimal wear on the soldering jig 202. In more detail, the height $H_1$ of the assembly 200 is determined by the thickness of the various subcomponents, i.e., the thickness of the first power electronics carrier 110, the thickness of the second power electronics carrier 112, the thickness of the semiconductor die 104, the thickness of the spacer 120, etc. As is known in the art, the dimensions of components can vary slightly due to processing deviations from a nominal or target value. Typically, parts are manufactured to conform to a particular standard, e.g., +/−1% deviation in thickness, length, etc, and all parts within this standard are considered passing. This known variation can create issues in the assembly process, particularly when multiple geometric deviations from target values are compounded. Particularly with respect to a soldering process using the soldering jig 202, the height $H_1$ of the assembly 200 may deviate as between multiple different assemblies that are nominally identical to one another. For instance, the thickness of a power electronics carrier, such as a DBC, DAB, AMB or IMS substrate can vary by +/−50 µm. Moreover, the thickness of the conductive spacer 120 can vary by +/−30 µm. These two factors alone mean that the height $H_1$ of two assemblies 200 that are nominally identical to one another can be significantly different from one another, e.g., by 50 µm, 75 µm or more. This deviation can increase complexity and maintenance of the soldering jig 202, as the potential deviation in the thicknesses of the various sub-components of the assemblies 200 is greater than the desired tolerances for the overall height $H_1$ of the assembly 200.

According to an embodiment of a soldering method, thickness values of one or more components of the assembly 200 arranged within the soldering jig 202 are selected so that the height $H_1$ of the assembly 200 is at least equal to the height of the soldering jig 202, i.e., the distance between the baseplate 204 and the upper end of the height limiting stopper 208, across a tolerance range of all components within the assembly 200. That is, the deviation from nominal thickness value is accounted for and nominal thickness values are selected so that even in a worst-case scenario the height of the assembly 200 is at least equal to the height of the soldering jig 202. In embodiments, nominal values can be selected such that the assembly 200 extends at least slightly past (e.g., 1 µm-5 µm past) the height limiting stopper 208. In any case, selecting the nominal thickness values such that the height $H_1$ of the assembly 200 is at least equal to the height of the soldering jig 202 across a tolerance range means that in most cases the assembly 200 will extend past the height limiting stopper 208 by significant amount, e.g., by 25 µm, 50 µm or more. The compressibility of the attachment layers in the assembly 200 advantageously accommodates this height difference without placing excessive wear on the upper plate 206 or causing defects in the soldered joints. Stated another way, the compressibility of the attachment layers provides a margin to absorb height variation in the assembly 200 and produces more conforming parts with less maintenance of the soldering jig 202.

Referring again FIG. 2, each of the first second, and third layers 124, 126, 128 of attachment material in the assembly 200 can be a compressible layer that comprises one or more elastomeric elements 134 embedded within a matrix of the solder material. This creates additional compressibility of the assembly 200 and simplifies the process, as the same attachment material can be used at each interface. Moreover, the solder material from each of the first second, and third layers 124, 126, 128 can be reflowed simultaneously in the case of identically configured layers of attachment material and/or if the matrix of solder material 136 has identical or similar reflow characteristics. Alternatively, at least one of the first second, and third layers 124, 126, 128 may be devoid of the elastomeric elements 134 and/or may comprise a different type of attachment material, e.g., sinter, glue, etc. Provided that the assembly 200 comprises at least one layer of attachment material 132 that is mechanically coupled to the semiconductor die 104, the above-described compression during soldering is possible.

Referring to FIG. 6, examples of other types of semiconductor devices that may include a compressible layer of attachment material 132 which forms a soldered joint are shown. In each case, the semiconductor devices are molded semiconductor packages 100 that are formed using an electrically conductive lead frame with a die pad 144 and leads 106 extending away from the die pad 144. A semiconductor die 104 is mounted on the die pad and the compressible layer of attachment material 132 is mechanically coupled to the semiconductor die 104.

In the embodiment of FIG. 6A, the semiconductor package 100 comprises a second semiconductor die 104 mounted on a first semiconductor die 104, which in turn is mounted on the die pad 144. The second semiconductor die 104 may be a logic device that is used to control a switching operation of the first semiconductor die 104, for example. The stacked arrangement 118 comprises a layer of attachment material 132 between the die pad 144 and the semiconductor die 104 and a layer of attachment material 132 at an interface between the first and second semiconductor dies 104. One or both of these layers of attachment material 132 may be a compressible layer that comprises one or more elastomeric elements 134 embedded within a matrix of solder material 136, as described and shown with reference to FIG. 3.

In the embodiment of FIG. 6B, the semiconductor package 100 comprises a single semiconductor die 104 mounted on the die pad 144. A layer of attachment material 132 is provided between the die pad 144 and the semiconductor die 104. The layer of attachment material 132 may be a compressible layer that comprises one or more elastomeric elements 134 embedded within a matrix of solder material 136, as described and shown with reference to FIG. 3. Using the compressible layer in this device and soldering according to the techniques described herein may be preferred in applications wherein precise control of the mounting height of the semiconductor die 104 is required, e.g., wherein minimum package body thickness is preferred. Optionally, this device may comprise a metal structure 146 attached to an upper side of the semiconductor die 104. This metal structure can be a metal clip used for electrical interconnect and/or may be a heat slug that provides thermal dissipation at the upper side of the semiconductor package 100. The metal structure 146 may be soldered to an upper side the semiconductor die 104 by a further layer of attachment material, which may also be a compressible layer of attachment material 132.

In addition to the above disclosed embodiments, the layer of attachment material 132 comprising one or more elastomeric elements 134 embedded within a matrix of solder material 136 and soldering technique described herein can be used in any semiconductor assembly with a soldering connection. These assembly types can include discrete device packages, e.g., discrete transistors, diodes, thyristors, etc., and integrated devices, e.g., controllers, sensors, analog devices, etc. These assembly types can also include power modules that comprise a housing that encloses an interior volume with a dielectric medium, e.g., air, potting compound, etc.

The semiconductor die 104 of the embodiments disclosed herein can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The semiconductor dies 104 of the embodiments disclosed herein can be configured as discrete power devices that are rated to accommodate voltages of different voltage classes, e.g., voltages of 20V, 50V, 100V, 600 V, 1200 V or more and/or are rated to accommodate currents of at least 1 A, 10 A, 100 A, 500 A or more. For example, the semiconductor dies 104 can be configured as discrete power transistor dies, for example MOSFETs (Metal Oxide Semiconductor Field Effect Transistors), IGBTs (Insulated Gate Bipolar Transistors), and HEMTs (High Electron Mobility Transistors), diodes, bipolar transistors, etc. The semiconductor dies 104 may be configured as vertical devices, which refers to a device that conducts a load current between opposite facing main and rear surfaces of the die. Alternatively, the semiconductor dies 104 may be configured as lateral devices, which refers to a device that conducts a load current parallel to a main surface of the die.

The term "metal substrate" as used herein refers to a metal layer or structure that accommodates the mounting of an electronics device, such as a semiconductor die, thereon. A "metal substrate" may be part of a metallization layer from a circuit carrier that additionally comprises a dielectric region beneath the metallization, e.g., a power electronics carrier or a printed circuit board. A "metal substrate" may also be from a die pad, lead frame, other metal structure with a metal surface at its rear side opposite from the electronics device.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

Although the present disclosure is not so limited, the following numbered examples demonstrate one or more aspects of the disclosure.

Example 1. A method of forming a semiconductor package, the method comprising: providing a first metal substrate; and mounting a stacked arrangement on the first metal substrate, the stacked arrangement comprising a semiconductor die, wherein mounting the stacked arrangement comprises: providing a first layer of attachment material between the first metal substrate and the stacked arrangement; and providing a second layer of attachment material within the stacked arrangement at an interface with the semiconductor die, wherein at least one of the first and second layers of attachment material is a compressible layer that comprises one or more elastomeric elements embedded within a matrix of solder material.

Example 2. The method of example 1, wherein the compressible layer comprises a plurality of elastomeric grain elements dispersed throughout a volume of the matrix of solder material.

Example 3. The method of example 2, wherein the elastomeric grain elements comprise a spherical core of elastomeric polymer.

Example 4. The method of example 1, wherein mounting the stacked arrangement comprises: providing a solder jig that comprises an upper plate and a height limiting stopper; arranging within the solder jig an assembly comprising the first metal substrate and the stacked arrangement disposed thereon; pressing the upper plate of the solder jig against the height limiting stopper with the assembly arranged within the solder jig; and reflowing the solder material, wherein before the pressing the assembly arranged within the solder jig extends at least to the height limiting stopper.

Example 5. The method of example 4, wherein before the pressing the assembly arranged within the solder jig extends past the height limiting stopper, and wherein pressing the upper plate of the solder jig against the height limiting stopper elastically compresses the one or more elastomeric elements.

Example 6. The method of example 4, further comprising selecting nominal height values of one or more components from the assembly comprising the first metal substrate and the stacked arrangement such that the height of the assembly arranged within the solder jig extends at least to the height limiting stopper across a range of process deviation from nominal height values the of one or more components.

Example 7. The method of example 1, further comprising providing a second metal substrate, wherein the stacked arrangement is mounted in between the first and second metal substrates, and wherein mounting the stacked arrangement comprises: providing a third layer of attachment material between the stacked arrangement and the second metal substrate.

Example 8. The method of example 7, wherein each of the first second, and third layers is a compressible layer that comprises one or more elastomeric elements embedded within a matrix of the solder material, and wherein mounting the stacked arrangement comprises reflowing the solder material from each of the first second, and third layers.

Example 9. The method of example 7, wherein the semiconductor package comprises a first power electronics carrier and a second power electronics carrier, wherein the first metal substrate corresponds to a pad portion of a structured metallization layer of the first power electronics carrier, wherein the second metal substrate corresponds to a pad portion of a structured metallization layer of the second power electronics carrier, and wherein the method further comprises forming an electrically insulating encapsulant body that encapsulates the stacked arrangement, wherein a rear side of the first power electronics carrier is exposed from a first side of the encapsulant body, and wherein a rear side of the second power electronics carrier is exposed from a second side of the encapsulant body.

Example 10. The method of example 7, wherein the stacked arrangement comprises an electrically conductive spacer, wherein the second layer of attachment material is disposed at an interface between the semiconductor die and the electrically conductive spacer.

Example 11. The method of example 1, wherein the stacked arrangement comprises a second semiconductor die, and wherein the second layer of attachment material is disposed at an interface between the semiconductor die and the second semiconductor die.

Example 12. A method of forming a semiconductor package, the method comprising: providing a first metal substrate; and mounting a semiconductor die on the first metal substrate, wherein mounting the semiconductor die comprises providing a first layer of attachment material between the semiconductor die and the first metal substrate, and wherein the first layer of attachment material is a compressible layer that comprises one or more elastomeric elements embedded within a matrix of solder material.

Example 13. The method of example 12, wherein the compressible layer comprises a plurality of elastomeric grain elements dispersed throughout a volume of the matrix of solder material, and wherein the elastomeric grain elements comprise an elastomeric polymer.

Example 14. A semiconductor device, comprising: a first metal substrate; a semiconductor die or a spacer mounted on the first metal substrate; and a layer of attachment material mechanically coupled to the semiconductor die or the spacer, wherein the layer of attachment material comprises one or more elastomeric elements embedded within a matrix of solder material.

Example 15. The semiconductor device of example 14, wherein the layer of attachment material comprises a plurality of elastomeric grain elements dispersed throughout a volume of the matrix of solder material.

Example 16. The semiconductor device of example 15, wherein the elastomeric grain elements comprise a core region of elastomeric polymer.

Example 17. The semiconductor device of example 16, wherein a diameter of the core region from each of the elastomeric grain elements is between 50 µm and 300 µm.

Example 18. The semiconductor device of example 16, wherein the elastomeric grain elements are elastically compressed.

Example 19. The semiconductor device of example 14, further comprising a second metal substrate, wherein the semiconductor device comprises the semiconductor die and the spacer, wherein the semiconductor die and the spacer are part of a stacked arrangement that is between the first and second metal substrates, and wherein the layer of attachment material is disposed at an interface between the stacked arrangement and one of the first and second metal substrates or at an interface within the stacked arrangement.

Example 20. The semiconductor device of example 14, further comprising a second semiconductor die mounted on the semiconductor die, wherein the layer of attachment material is disposed at an interface between the first metal substrate and the semiconductor die or at an interface between the first and second semiconductor dies.

The invention claimed is:

1. A method of forming a semiconductor package, the method comprising:
   providing a first metal substrate; and
   mounting a stacked arrangement on the first metal substrate, the stacked arrangement comprising a semiconductor die,
   wherein mounting the stacked arrangement comprises:
      providing a first layer of attachment material between the first metal substrate and the stacked arrangement; and
      providing a second layer of attachment material within the stacked arrangement at an interface with the semiconductor die,
      wherein at least one of the first and second layers of attachment material is a compressible layer that comprises one or more elastomeric elements embedded within a matrix of solder material.

2. The method of claim 1, wherein the compressible layer comprises a plurality of elastomeric grain elements dispersed throughout a volume of the matrix of solder material.

3. The method of claim 2, wherein the elastomeric grain elements comprise a spherical core of elastomeric polymer.

4. The method of claim 1, wherein mounting the stacked arrangement comprises:
   providing a solder jig that comprises an upper plate and a height limiting stopper;
   arranging within the solder jig an assembly comprising the first metal substrate and the stacked arrangement disposed thereon;
   pressing the upper plate of the solder jig against the height limiting stopper with the assembly arranged within the solder jig; and
   reflowing the solder material,
   wherein before the pressing the assembly arranged within the solder jig extends at least to the height limiting stopper.

5. The method of claim 4, wherein before the pressing the assembly arranged within the solder jig extends past the height limiting stopper, and wherein pressing the upper plate of the solder jig against the height limiting stopper elastically compresses the one or more elastomeric elements.

6. The method of claim 4, further comprising selecting nominal height values of one or more components from the assembly comprising the first metal substrate and the stacked arrangement such that the height of the assembly arranged within the solder jig extends at least to the height limiting stopper across a range of process deviation from nominal height values the of one or more components.

7. The method of claim 1, further comprising providing a second metal substrate, wherein the stacked arrangement is mounted in between the first and second metal substrates, and wherein mounting the stacked arrangement comprises:
   providing a third layer of attachment material between the stacked arrangement and the second metal substrate.

8. The method of claim 7, wherein each of the first second, and third layers is a compressible layer that comprises one or more elastomeric elements embedded within a matrix of the solder material, and wherein mounting the stacked arrangement comprises reflowing the solder material from each of the first second, and third layers.

9. The method of claim 7, wherein the semiconductor package comprises a first power electronics carrier and a second power electronics carrier, wherein the first metal substrate corresponds to a pad portion of a structured metallization layer of the first power electronics carrier, wherein the second metal substrate corresponds to a pad portion of a structured metallization layer of the second power electronics carrier, and wherein the method further comprises forming an electrically insulating encapsulant body that encapsulates the stacked arrangement, wherein a rear side of the first power electronics carrier is exposed from a first side of the encapsulant body, and wherein a rear side of the second power electronics carrier is exposed from a second side of the encapsulant body.

10. The method of claim 7, wherein the stacked arrangement comprises an electrically conductive spacer, wherein the second layer of attachment material is disposed at an interface between the semiconductor die and the electrically conductive spacer.

11. The method of claim 1, wherein the stacked arrangement comprises a second semiconductor die, and wherein the second layer of attachment material is disposed at an interface between the semiconductor die and the second semiconductor die.

12. A method of forming a semiconductor package, the method comprising:
   providing a first metal substrate; and
   mounting a semiconductor die on the first metal substrate,
   wherein mounting the semiconductor die comprises providing a first layer of attachment material between the semiconductor die and the first metal substrate, and
   wherein the first layer of attachment material is a compressible layer that comprises one or more elastomeric elements embedded within a matrix of solder material.

13. The method of claim 12, wherein the compressible layer comprises a plurality of elastomeric grain elements dispersed throughout a volume of the matrix of solder material, and wherein the elastomeric grain elements comprise an elastomeric polymer.

14. A semiconductor device, comprising:
a first metal substrate;
a semiconductor die or a spacer mounted on the first metal substrate; and
a layer of attachment material mechanically coupled to the semiconductor die or spacer,
wherein the layer of attachment material comprises one or more elastomeric elements embedded within a matrix of solder material.

15. The semiconductor device of claim 14, wherein the layer of attachment material comprises a plurality of elastomeric grain elements dispersed throughout a volume of the matrix of solder material.

16. The semiconductor device of claim 15, wherein the elastomeric grain elements comprise a core region of elastomeric polymer.

17. The semiconductor device of claim 16, wherein a diameter of the core region from each of the elastomeric grain elements is between 50 μm and 300 μm.

18. The semiconductor device of claim 16, wherein the elastomeric grain elements are elastically compressed.

19. The semiconductor device of claim 14, further comprising a second metal substrate, wherein the semiconductor device comprises the semiconductor die and the spacer, and wherein the semiconductor die and the spacer are part of a stacked arrangement that is between the first and second metal substrates, and wherein the layer of attachment material is disposed at an interface between the stacked arrangement and one of the first and second metal substrates or at an interface within the stacked arrangement.

20. The semiconductor device of claim 14, further comprising a second semiconductor die mounted on the semiconductor die, wherein the layer of attachment material is disposed at an interface between the first metal substrate and the semiconductor die or at an interface between the first and second semiconductor dies.

* * * * *

UNITED STATES PATENT AND TRADEMARK OFFICE
CERTIFICATE OF CORRECTION

PATENT NO. : 12,249,561 B2
APPLICATION NO. : 17/743601
DATED : March 11, 2025
INVENTOR(S) : T. Scharf et al.

Page 1 of 1

It is certified that error appears in the above-identified patent and that said Letters Patent is hereby corrected as shown below:

In the Claims

Column 14, Line 16 (Claim 6, Line 7) please change "the of one" to -- of the one --

Column 14, Line 23 (Claim 8, Line 1) please change "first second" to -- first, second --

Column 14, Line 28 (Claim 8, Line 6) please change "first second" to -- first, second --

Signed and Sealed this
Thirteenth Day of May, 2025

Coke Morgan Stewart
*Acting Director of the United States Patent and Trademark Office*